(12) United States Patent
Bal et al.

(10) Patent No.: US 7,180,792 B2
(45) Date of Patent: Feb. 20, 2007

(54) EFFICIENT LATCH ARRAY INITIALIZATION

(75) Inventors: Ankur Bal, Ghaziabad (IN); Manish Agarwal, Lucknow (IN)

(73) Assignee: STMicroelectronics Pvt. Ltd. (IN)

( * ) Notice: Subject to any disclaimer, the term of this patent is extended or adjusted under 35 U.S.C. 154(b) by 300 days.

(21) Appl. No.: 10/377,297

(22) Filed: Feb. 28, 2003

(65) Prior Publication Data

US 2003/0223298 A1 Dec. 4, 2003

(30) Foreign Application Priority Data

Feb. 28, 2002 (IN) ........................... 182/02

(51) Int. Cl.
*G11C 7/10* (2006.01)
(52) U.S. Cl. .................. 365/189.05; 365/189.04; 365/189.09; 365/191
(58) Field of Classification Search ........ 365/189.05, 365/189.04, 189.09, 191
See application file for complete search history.

(56) References Cited

U.S. PATENT DOCUMENTS

| 6,125,064 | A  | * | 9/2000  | Kim et al. ............... 365/193 |
| 6,301,173 | B2 |   | 10/2001 | Fujioka et al. |
| 6,310,500 | B1 | * | 10/2001 | Varma .................... 327/211 |
| 6,570,800 | B2 | * | 5/2003  | Tanaka et al. ........... 365/219 |
| 6,819,612 | B1 | * | 11/2004 | Achter .................... 365/205 |
| 6,839,298 | B2 | * | 1/2005  | Yung .................... 365/225.7 |

\* cited by examiner

*Primary Examiner*—Van Thu Nguyen
*Assistant Examiner*—Pho M. Luu
(74) *Attorney, Agent, or Firm*—Lisa K. Jorgenson; J. Mark Han; Graybeal Jackson Haley LLP

(57) ABSTRACT

An efficient method and electronic circuit for initializing latch arrays in an electronic device including an FPGA and a memory device includes a group of one or more data latches, each including a pair of cross-coupled inverting logic elements, characterized in that it includes a means for simultaneously initializing each data latch to a predetermined logic state, without requiring significant additional circuitry.

29 Claims, 2 Drawing Sheets

EFFICIENT LATCH ARRAY INITIALIZATION

PRIORITY CLAIM

This application claims priority from Indian patent application No. 182/Del/2002, filed Feb. 28, 2002, which is incorporated herein by reference.

TECHNICAL FIELD

The present invention relates to the field of electronic circuits and electronic devices. In particular, it relates to an efficient method and electronic circuit for initializing latch arrays in an electronic device including a Field Programmable Gate Array (FPGA) and a memory device.

BACKGROUND

A latch array or matrix is widely used in applications that depend on SRAM latches for their operation, the most common being flash memories, Complex Programmable Logic Devices (CPLDs) and FPGAs. A latch array consists of a finite number of latches with each latch storing a unique bit. There are signals and structures associated with a latch array for group control of the latches. One such signal can set/reset the latch array. Referring to FIG. 1, the most conventional way of providing an initialization signal to the latches is through a pass transistor 2 connected to every latch 1. Basic latch construction of back-to-back 1a & 1b connected inverters is shown. The gates of the pass transistors 2 are tied together and a common set/reset signal 3 drives them.

Another known method of initializing the latches requires the use of an addressing or decoding scheme to access the latches individually or in groups. During the access cycle, the latches visible to the configuration data frame are loaded with the set/reset bit. This approach requires many clock cycles to initialize the latch array.

U.S. Pat. No. 6,301,173 B2 describes another technique for improving the speed of resetting of a latch array. However, this technique requires additional hardware in the form of bit line clampers, short-circuits and transfer control circuits to be added for each bit line pair, thereby making the size of the latch array significantly bigger.

SUMMARY

An embodiment of this invention provides an efficient electronic circuit and method for simultaneous initialization of a latch array without requiring significant additional circuitry.

This embodiment provides an electronic circuit comprising a group of one or more data latches, each comprising a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to any one of the inverting logic elements in each data latch causing the data latch to settle into the predetermined state.

The said means comprises a binary selector that enables the voltage from either the first or the second terminal of a power supply source to its output based on the state of a binary control signal.

The said binary selector comprises a logic inverter, which receives the binary control signal at its input.

Another embodiment of the present invention provides an electronic device comprising a group of one or more data latches, each comprising a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

The said means comprises a binary selector that enables the voltage from either the first or the second terminal of a power supply source to its output based on the state of a binary control signal.

The said binary selector comprises a logic inverter that receives the binary control signal at its input.

Yet another embodiment of the present invention provides an FPGA including a group of one or more data latches, each comprising a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

The said means comprises a binary selector that enables the voltage from either the first or the second terminal of a power supply source to its output based on the state of a binary control signal.

The said binary selector comprises a logic inverter that receives the binary control signal at its input.

Still another embodiment of the present invention provides a memory device comprising a group of one or more data latches, each comprising a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

The said means comprises a binary selector that enables the voltage from either the first or the second terminal of a power supply source to its output based on the state of a binary control signal.

The said binary selector comprises a logic inverter that receives the binary control signal at its input.

Another embodiment of the instant invention provides a method for enabling the simultaneous initialization of a group of one or more data latches, each comprising a pair of cross-coupled inverting logic elements, wherein each data latch is initialized to a predetermined logic state, without requiring any additional circuit elements with any data latch for this purpose and without the need for sequentially accessing each data latch, comprising the steps of:

providing a single, controllable binary selector for enabling the voltage from either the first or the second terminal of a power supply source to its output based on the state of a binary control signal, connecting a first power supply input terminal common to one of the inverting logic elements in each data latch, to the output of said binary selector, instead of connecting it directly to the first terminal of the power supply source, with the second power supply input terminal common to said inverting logic elements remaining directly connected to the second terminal of the power supply source, and setting the binary control signal to a predefined logic level for initializing the group of data latches, causing the binary selector to connect the first power supply input terminal to the second terminal of the power supply source thereby forcing all the data latches to their desired states.

The controllable binary selection function is provided by a logic inverter receiving the binary control signal at its input.

BRIEF DESCRIPTION OF THE DRAWINGS

The invention will now be described with reference to the accompanying drawings.

DETAILED DESCRIPTION

Figure 1:
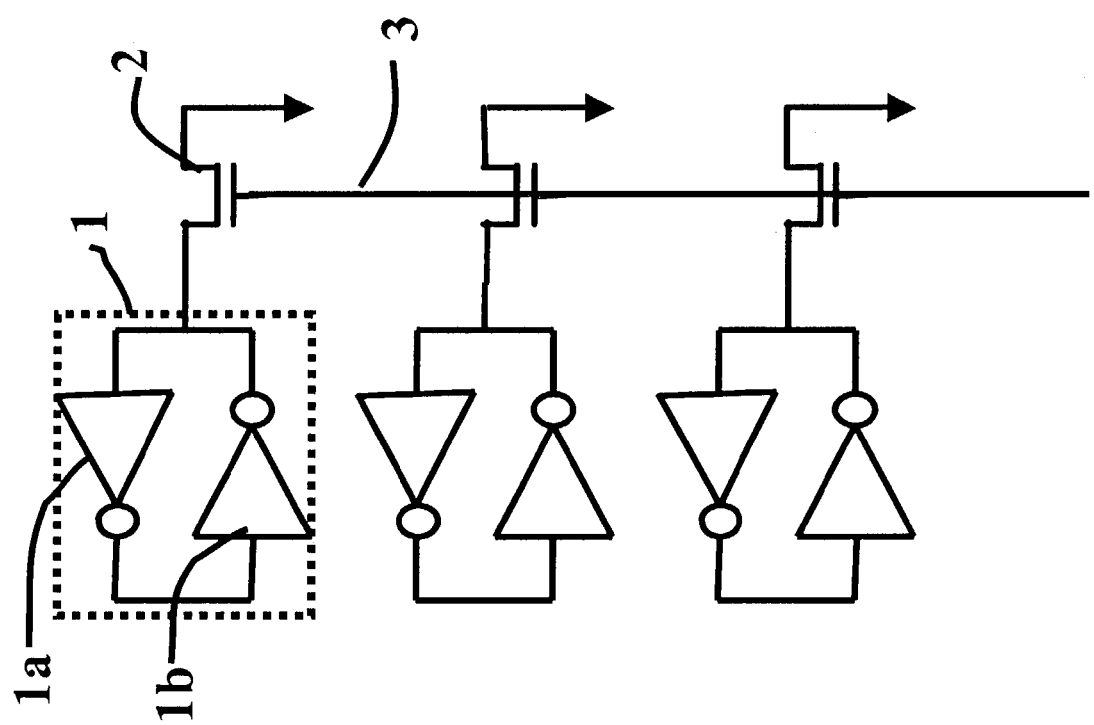
FIG. 1 shows a data latch array containing additional resetting circuitry, according to the prior art.

FIG. 1 has already been described in the background of the invention

Figure 2:
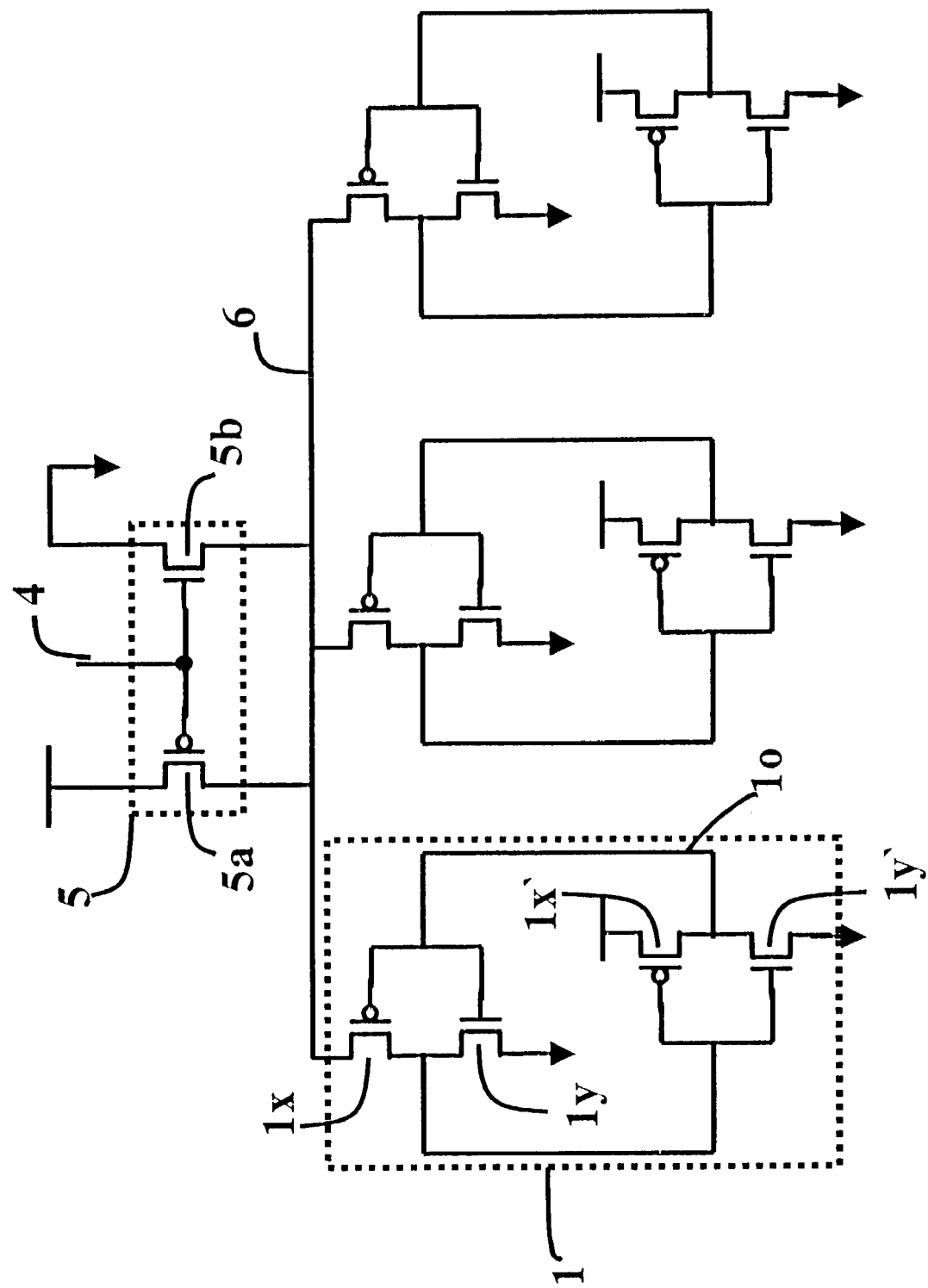
FIG. 2 shows a data latch array according to a preferred embodiment of the present invention.

In the preferred embodiment of FIG. 2, the latches are implemented in CMOS technology. The PMOS transistor $1x$ of the one of the back to back connected inverters in every latch of the latch array is interfaced to the positive power supply rail through a common control circuit 5. The two control transistors $5a$ & $5b$ are inserted in the power supply arrangement to the latches in order to facilitate initialization of the latch cluster. By altering the polarity of the supply to the latches via a control signal 4, the latch circuit arrangement is forced to attain a predictable stable state. The control circuit comprising an NMOS $5b$ and a PMOS $5a$ transistor is basically a CMOS inverter whose input is the initialization control signal 4.

Still referring to FIG. 2, when control signal 4 goes high, the source of PMOS $1x$ is pulled down to ground potential. This results in a half latch circuit made of a remnant NMOS $1y$ and an inverter $1x'$, $1y'$. The induced half latch attains its stable state shortly. It is obvious that the stable state in the present example at $1o$ would be logic 1. Once the half-latch data stabilizes, normal polarity to the PMOS $1x$ of the inverter 1 is restored. Thus, by inserting two transistors in a latch array, one can set/reset them all in unison.

Still referring to FIG. 2, other than initializing the latches at runtime, it is also possible to power-on-se/reset the latch array. By pulling up the control line 4 before turning on the circuit in the given embodiment, the latch array will switch on to its stable state. This is again attributed to the initial half latch condition of the array.

Thus, this embodiment of the invention provides an efficient way of latch initialization. The area overheads involved are minimal even for big array sizes.

It will be apparent to those with ordinary skill in the art that the foregoing is merely illustrative and not intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings.

What is claimed is:

1. An electronic circuit comprising a group of one or more data latches, each consisting of a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to any one of the inverting logic elements in each data latch causing the data latch to settle into the predetermined state.

2. An electronic circuit as claimed in claim 1 wherein said means is a binary selector that enables the voltage from either the first or the second terminal of a power supply source to its output based on the state of a binary control signal.

3. An electronic circuit as claimed in claim 2 wherein said binary selector is a logic inverter which receives the binary control signal at its input.

4. An electronic device comprising a group of one or more data latches, each consisting of a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

5. An electronic device as claimed in claim 4 wherein said means is a binary selector that enables the voltage from either the first or the second terminal of a power supply source to its output based on the state of a binary control signal.

6. An electronic device as claimed in claim 5 wherein said binary selector is a logic inverter that receives the binary control signal at its input.

7. An FPGA including a group of one or more data latches, each consisting of a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

8. An FPGA as claimed in claim 7 wherein said means is a binary selector that enables the voltage from either the first or the second terminal of a power supply source to its output based on the state of a binary control signal.

9. An FPGA as claimed in claim 8 wherein said binary selector is a logic inverter that receives the binary control signal at its input.

10. A memory device comprising a group of one or more data latches, each consisting of a pair of cross-coupled inverting logic elements, characterized in that it includes a means for simultaneously initializing each data latch to a predetermined logic state, without requiring any additional circuit elements with any data latch for this purpose and without the need for sequentially accessing each data latch, by controlling the polarity of the power supply voltage applied to one of the power supply terminals common to one of the inverting logic elements in each data latch causing the data latch to settle into the predetermined state.

11. A memory device as claimed in claim 10 wherein said means is a binary selector that enables the voltage from either the first or the second terminal of a power supply source to its output based on the state of a binary control signal.

12. A memory device as claimed in claim 11 wherein said binary selector is a logic inverter that receives the binary control signal at its input.

13. A method for enabling the simultaneous initialization of a group of one or more data latches, each consisting of a pair of cross coupled inverting logic elements, wherein each data latch is initialized to a predetermined logic state, without requiring any additional circuit elements with any data latch for this purpose and without the need for sequentially accessing each data latch, comprising the steps of:
providing a single, controllable binary selector for enabling the voltage from either the first or the second terminal of a power supply source to its output based on the state of a binary control signal,
connecting a first power supply input terminal common to one of the inverting logic elements in each data latch, to the output of said binary selector, instead of connecting it directly to the first terminal of the power supply source, with the second power supply input terminal common to said inverting logic elements remaining directly connected to the second terminal of the power supply source, and
setting the binary control signal to a predefined logic level for initializing the group of data latches, causing the binary selector to connect the first power supply input terminal to the second terminal of the power supply source thereby forcing all the data latches to their desired states.

14. A method as claimed in claim 13 wherein the controllable binary selection function is provided by a logic inverter receiving the binary control signal at its input.

15. A circuit, comprising:
first and second main supply nodes;
a plurality of data latches each having a first latch supply node coupled to the first main supply node and having a second latch supply node coupled to a common supply node; and
a control circuit operable to couple the common supply node to the first main supply node during a first mode of operation and to the second main supply node during a second mode of operation.

16. The electronic circuit of claim 15 wherein:
the data latches each comprise two respective back-to-back connected inverters, one of the two inverters coupled to the common supply node; and
the control circuit further comprises an inverter having an output node coupled to the common supply node.

17. A circuit, comprising:
first and second main supply nodes;
a data latch having a first latch supply node coupled to the first main supply node and having a second latch supply node; and
a control circuit operable to couple the second latch supply node to the first main supply node during a first mode of operation and to the second main supply node during a second mode of operation.

18. The circuit of claim 17 wherein:
the first mode of operation comprises a reset mode of operation; and
the second mode of operation comprises a data-storage mode of operation.

19. The circuit of claim 17 wherein:
the first main supply node is operable to receive a negative supply voltage; and
the second main supply node is operable to receive a positive supply voltage.

20. The circuit of claim 17 wherein:
the first main supply node is coupled to ground; and
the second main supply node is operable to receive a positive supply voltage.

21. The circuit of claim 17 wherein the data latch has a third latch supply node coupled to the second main supply node.

22. A circuit, comprising:
first and second main supply nodes;
a data latch having a first latch supply node coupled to the first main supply node and having a second latch supply node; and
a switch circuit having a control node, a first input node coupled to the first main supply node, a second input node coupled to the second main supply node, and an output node coupled to the second latch supply node.

23. The circuit of claim 22 wherein the data latch further comprises:
a third latch supply node coupled to the second main supply node;
a first inverter coupled to the first and second latch supply nodes; and
a second inverter coupled to the first and third latch supply nodes.

24. The circuit of claim 22 wherein the control circuit comprises:
a first transistor coupled between the first main supply node and the second latch supply node and coupled to the control node; and
a second transistor coupled between the second main supply node and the second latch supply node and coupled to the control node.

25. A method comprising:
driving a first supply node of a latch to a first voltage to write a predetermined data value to the latch, the latch having a second supply node coupled to the first voltage; and
driving the first supply node to a second voltage.

26. A method comprising:
driving a supply node of a latch to a first voltage to write a predetermined data value to the latch, wherein the first voltage substantially equals zero volts; and
driving the supply node to a second voltage, wherein the second voltage equals a positive voltage.

27. A method for setting a latch to a predetermined state, the method comprising:
driving first and second supply nodes of the latch to a first voltage; and driving the first supply node to a second voltage while maintaining the second supply node at the first voltage.

28. An electronic system, comprising:
an integrated circuit comprising,
  first and second main supply nodes;
  a plurality of data latches each having a first latch supply node coupled to the first main supply node and having a second latch supply node coupled to a common supply node, and
  a control circuit operable to couple the common supply node to the first main supply node during a first mode of operation and to the second main supply node during a second mode of operation.

29. A method of setting a plurality of latches to respective predetermined values, the method comprising:
  driving respective first and second supply nodes of each of the plurality of latches to a first voltage; and
  driving the respective first supply node of each of the plurality of latches to a second voltage while maintaining the respective second supply node of each of the plurality of latches at the first voltage.

* * * * *